United States Patent [19]

James

[11] 3,872,388

[45] Mar. 18, 1975

[54] RESOLVER TO DC CONVERTER

[75] Inventor: Robert L. James, Bloomfield, N.J.

[73] Assignee: The Bendix Corporation, Teterboro, N.J.

[22] Filed: Aug. 31, 1972

[21] Appl. No.: 285,267

[52] U.S. Cl. ............ 328/133, 307/232, 340/347 SY

[51] Int. Cl. ............ H03d 13/00

[58] Field of Search .............. 340/347 SY; 328/133; 307/232

[56] References Cited

UNITED STATES PATENTS

| | | | |
|---|---|---|---|
| 3,438,026 | 4/1969 | Prill | 340/347 SY |
| 3,504,361 | 3/1970 | Catton | 340/347 SY |
| 3,626,169 | 12/1971 | Rudolph | 340/347 SY |
| 3,676,659 | 7/1972 | Asmussen | 340/347 SY |

*Primary Examiner*—Thomas J. Sloyan

*Attorney, Agent, or Firm*—Anthony F. Cuoco; S. H. Hartz

[57] ABSTRACT

A converter for converting resolver sine and cosine output to a d.c. signal which is a linear function of resolver shaft angle and including means for comparing the resolver sine output with a reference signal generated from the sine and cosine outputs, and which reference signal has an amplitude equal to the maximum excursion of said outputs so as to be independent of shaft angle change for providing a more accurate conversion.

7 Claims, 4 Drawing Figures

RESOLVER TO DC CONVERTER

BACKGROUND OF THE INVENTION

1. Field of the Invention

This invention relates generally to resolver to d.c. converters and, more particularly, to a novel circuit for converting resolver sine and cosine shaft angle outputs into a linear bipolar d.c. signal.

2. Description of the Prior Art

Conversion of resolver outputs is an essential function in automatic flight control systems. The conversion equipment must accomplish its task accurately and with a high degree of simplicity. Prior art converters, such as described in U.S. Pat. No. 3,510,867 issued on May 5, 1970 to R. A. Sliwa and assigned to The Bendix Corporation assignee of the present invention, require bulky circuitry. The present invention is well adapted to microelectronics techniques and this accomplishes the conversion with a degree of simplicity heretofore not attainable.

SUMMARY OF THE INVENTION

This invention contemplates a resolver to d.c. converter wherein the resolver sine output is demodulated and then summed with a reference sine wave derived from the resolver sine and cosine outputs to provide a pulse width modulated wave which is compared with an unmodulated reference square wave also derived from the resolver sine and cosine outputs. The comparison output is directly proportional to the resolver shaft angle position over a range from 0° to ±90°. The proportional output is filtered to provide a d.c. signal which is a linear function of the resolver shaft angle.

One object of this invention is to provide a novel combination of microelectronics components for converting resolver shaft angle outputs into a linear bipolar d.c. signal.

Another object of this invention is to perform the conversion accurately and with a high degree of simplicity.

Another object of this invention is to perform the conversion by using a reference sine wave having an amplitude independent of resolver shaft angle change and equal to the maximum excursion of the resolver outputs for increased accuracy.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
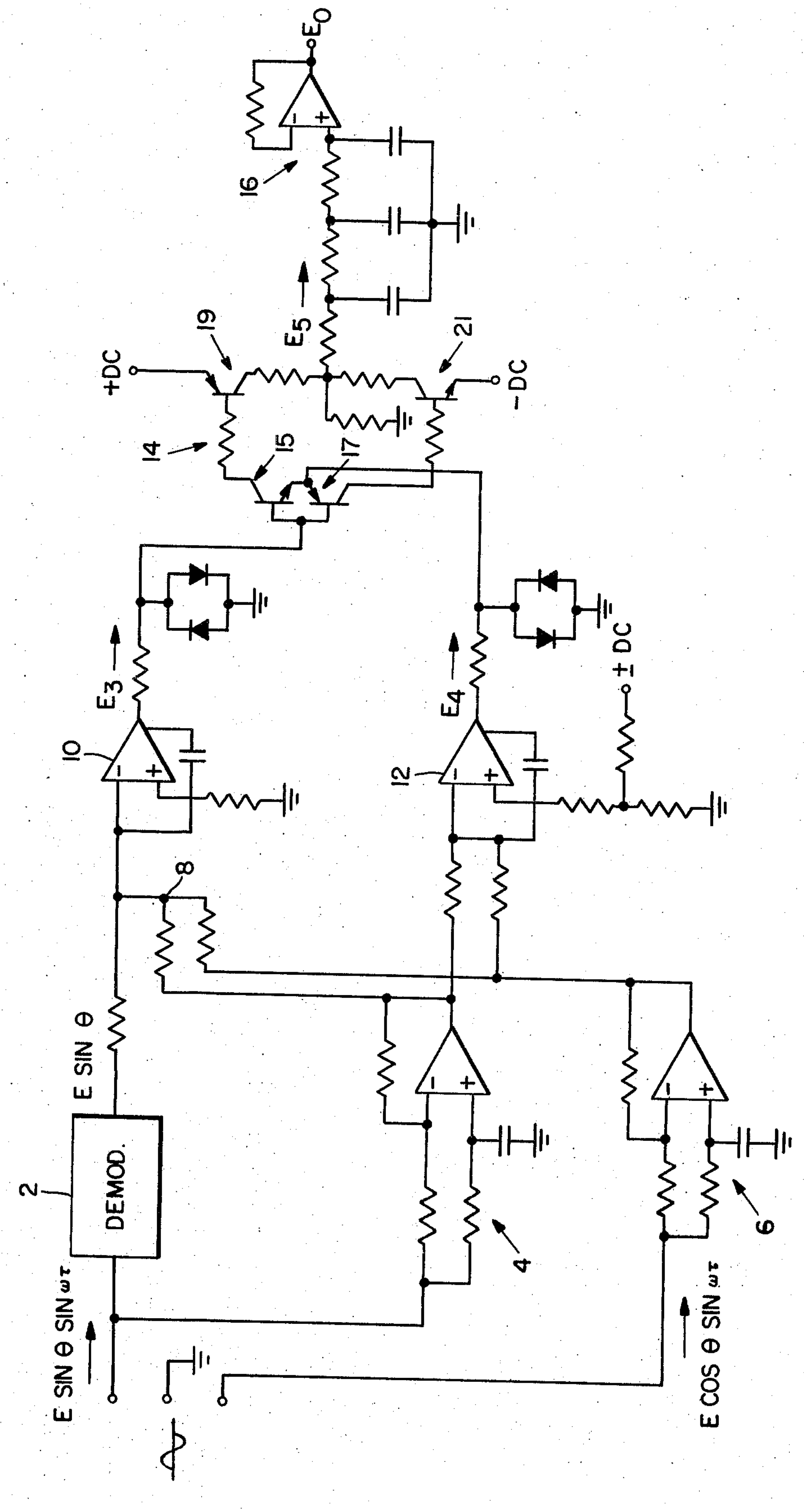
FIG. 1 is an electrical schematic diagram of a resolver to d.c. converter according to the invention.

A resolver such as described in the aforenoted U.S. Pat. No. 3,510,867 includes an input winding connected to an alternating current source and excited by a 400 cycle signal E therefrom, and an output winding having a pair of mutually perpendicular coils mounted on a shaft. When the shaft is rotated through an angle $\theta$, resolver outputs E sine $\theta$ Sine $\omega t$ and E cosine $\theta$ sine $\omega t$ are induced in the mutually perpendicular coils and are applied as inputs to the converter of the invention as shown in FIG. 1.

Signal E sine $\theta$ sine $\omega t$ is applied to a conventional chopper type demodulator 2 which provides a d.c. output E sine $\theta$. Signal E sine $\theta$ sine $\omega t$ is applied to a phase shifting circuit 4 and signal E cosine $\theta$ sine $\omega t$ is applied to a phase shifting circuit 6. The outputs from phase shifting circuits 4 and 6 are summed at a point 8 to provide a 400 cycle reference sine wave.

Signal E sine $\theta$ from demodulator 2 and the reference sine wave from point 8 are applied to an inverting (−) input terminal of a high gain operational amplifier 10 connected in open loop configuration. Amplifier 10 provides a pulse width modulated signal $E_3$ having waveforms as shown in FIGS. 2, 3 and 4.

Figures 3, 4:
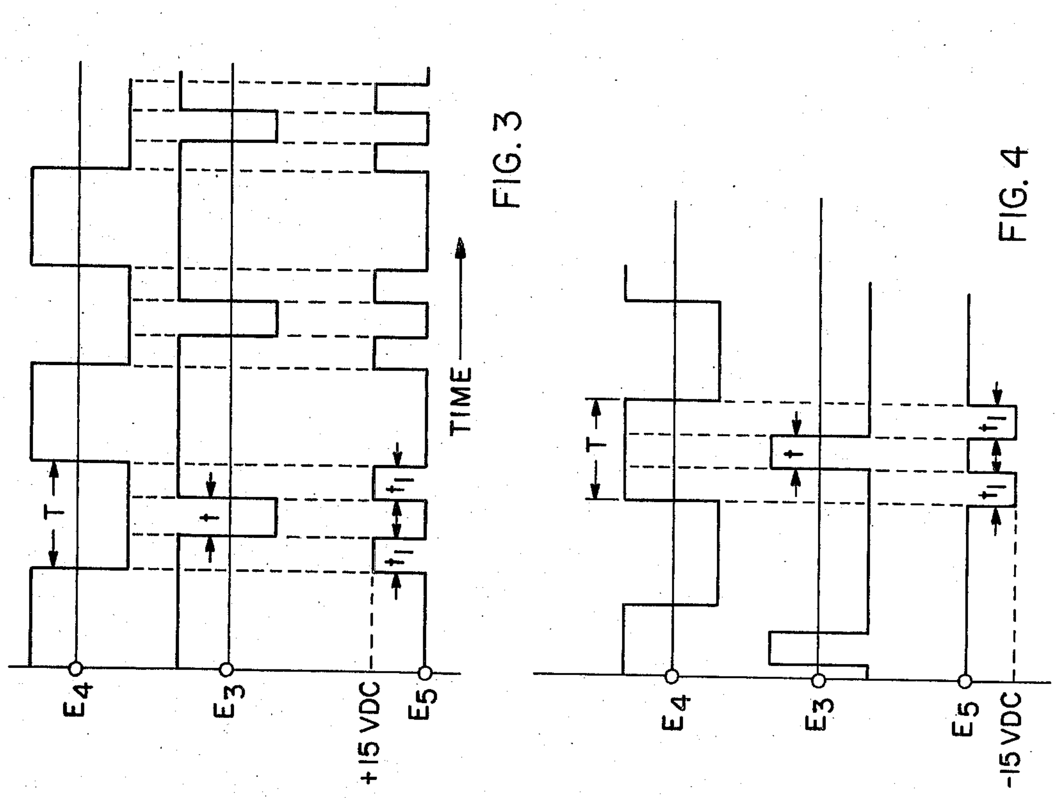
FIGS. 2, 3 and 4 are waveform charts showing relationships of various signals provided according to the invention.
Figure 2:
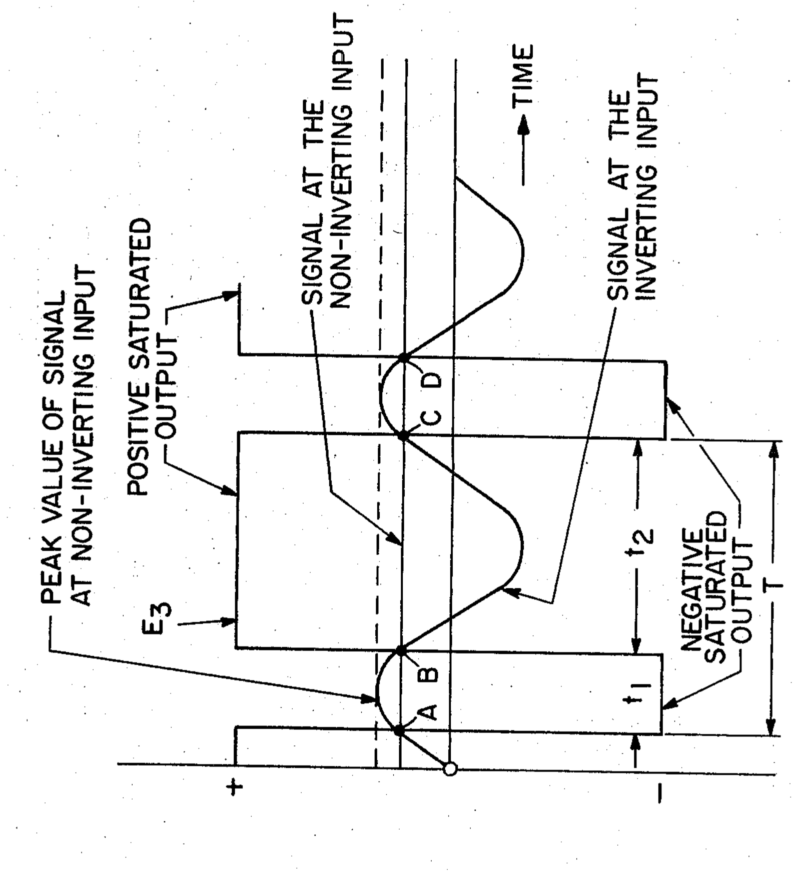

The signals from phase shifting circuits 4 and 6 are applied to an open loop operational amplifier 12 which acts as a squaring amplifier and provides a signal $E_4$ having a waveform as shown in FIGS. 2, 3, and 4. Signal $E_4$ is an unmodulated reference square wave having a 400 cycle frequency as does the reference signal provided at point 8.

Signals $E_3$ and $E_4$ are compared in an exclusive OR logic circuit 14. Circuit 14 provides a signal $E_5$ having a waveform as shown in FIGS. 2, 3 and 4. The full cycle average value of signal $E_5$ is directly proportional to resolver shaft angle $\theta$ over an angular range from 0° to ± 90°. Signal $E_5$ is applied to a simple low pass RC filter and buffer amplifier circuit 16 for providing a d.c. output $E_0$ which is the required linear function of resolver shaft angle $\theta$.

The purpose of phase shifting circuits 4 and 6 will be better understood when it is considered that the conversion provided by the device of the invention assumes that the peak value of the 400 cycle reference sine wave at point 8 is always equal to the peak amplitude excursion E of demodulated signal E sine $\theta$ from demodulator 2. In order to achieve this, the reference sine wave is generated from the resolver signals. Thus, any change in one will cause a corresponding change in the other so that they track and always remain equal as required.

The reference sine wave also must have an amplitude independent of resolver shaft angle change, whereas the resolver outputs have amplitudes which vary with shaft angle change. In order to accomplish this, phase shifting circuits 4 and 6 perform a trigonometric conversion on resolver outputs E sine $\theta$ sine $\omega t$ and E cos $\theta$ sine $\omega t$, respectively, and which outputs vary in amplitude, to provide a sine wave output which does not vary in amplitude and which is equal to the maximum amplitude excursion E of the resolver signals. To this end, phase shifting circuit 4 may be arranged to provide a phase lag of −45° while phase shifting circuit 6 may be arranged to provide a phase lag of −135°.

OPERATION OF THE INVENTION

In order to understand the operation of the invention it is first necessary to review the response of open loop operation amplifiers such as amplfier 10 in FIG. 1 to input signals applied to the inverting (−) and non-inverting (+) input terminals of the amplifier. Thus, on an instantaneous basis, if the signal applied to the (+) input terminal is more positive by a millivolt or more than the signal applied to the (−) terminal, the extremely high internal gain of the amplifier which occurs since there is no feedback will cause its output ($E_3$) to be at positive saturation. Likewise for the opposite polarity of this differential input to the amplifier, the amplifier output will be at negative saturation. It can be said, therefore, that at any time when the two inputs are not within a millivolt or so of being equal to each other, the amplifier output will be steadily at either positive or negative saturation.

If the signal applied to the non-inverting (+) input terminal is at some steady positive d.c. level with respect to ground and the signal applied to the inverting (−) input terminal is negative with respect to ground, but is rising in a positive direction as some function of time, the amplifier output will at first be steadily positive since the signal at the non-inverting input terminal is more positive than the signal at the inverting input terminal by more than a millivolt. However, a time will arrive when the signal at the inverting input terminal will have risen to a level where, for a relatively short duration of time, it is in a region within ± 1 millivolt of the value of the signal at the non-inverting input terminal. As the signal at the inverting input terminal passes through this region it suddenly becomes more positive than the other signal and the amplifier switches from positive to negative saturation as shown in FIG. 2. Thus, if the signal at the inverting input terminal varies through a cycle of a 400 cycle sine wave starting from zero, and the signal at the non-inverting input terminal is at some steady positive d.c. level greater than zero but less than the peak excursion of the signal at the inverting input terminal, it is seen that in its first quarter cycle, point A in FIG. 2, the signal at the inverting input terminal will rise past the signal at the non-inverting input terminal, causing the amplifier output to switch from positive saturation to negative saturation. Then later in the second quarter cycle, as indicated by point B in FIG. 2, the signal at the non-inverting input terminal again is more positive than the signal at the inverting input terminal and causes the amplifier output to return from negative saturation back to positive saturation. This variation of amplifier output is shown in FIG. 2 as the rectangular 400 cycle signal $E_3$ having a low duty cycle. The intersection of signal $E_3$ and the signals at the inverting and non-inverting inputs of the amplifier at points C and D in FIG. 2 are repetitions in the next cycle of events of points A and B as heretofore explained.

With further reference to FIG. 2, the rectangular waveform of signal $E_3$ is unsymetrical in that the wave is longer at positive saturation than at negative saturation. In effect, then, signal $E_3$ has a positive average value or a positive d.c. component. If the signal at the non-inverting input terminal of amplifier 10 is raised to a new positive value but still less than the peak value of the signal at the inverting input terminal, it will be seen graphically from FIG. 2 that intersection point A will move closer to point B and intersection point C will move closer to point D, giving a new output wave with a negative saturated portion during the interval $t_1$ which is even narrower than before and results in a greater d.c. component of positive polarity. The d.c. component is mathematically the positive volt-second area all divided by the time (T) for one cycle.

It can be shown mathematically that the duty cycle of signal $E_3$ varies linearly with respect to resolver shaft angle, but this can also be seen intuitively. If the resolver shaft is rotated uniformly, the signal at the non-inverting input terminal of amplifier 10 rises more and more slowly toward a peak since it is a sine function of the shaft angle. But intersection points A and B shown in FIG. 2, which determine the duty cycle, tend to close more and more rapidly since they come more and more into the flatter region of the sine waveform of the signal at the non-inverting input terminal. Hence, the slowing down of the signal at the inverting input terminal, which is opposite to the tendency for more rapid closure of points A and B, results in points A and B actually closing at a uniform rate. Therefore, the duty cycle of signal $E_3$, and hence its d.c. component, changes linearly with respect to resolver shaft angle.

Although low pass filter 16 connected to the output of amplifier 10 as shown in FIG. 1 extracts the d.c. component of signal $E_3$ and provides the required converter output signal, for purposes of accuracy it is necessary to use squaring amplifier 12 and exclusive OR circuit 14. The use of these components is prompted by the unequal and environmentally variable (+) and (−) saturated output levels of amplifier 10. With reference to FIG. 2, when the signal at the non-inverting input terminal of amplifier 10 is zero (corresponding to the sine function of zero shaft angle) a 50—50 duty cycle square wave signal $E_3$ is provided by amplifier 10 which has a zero average d.c. output component. This is true only if the (+) or (−) amplitudes of square wave signal $E_3$ are accurately equal. However, as heretofore noted, these amplitudes are the (+) and (−) saturated voltage output extremes of amplifier 10 and are thus quite unequal, with the inequality varying with environmental conditions. This results in large inaccuracies which occur when two large, slightly unequal numbers are subtracted to give zero.

To avoid this error, square wave signal $E_4$ generated from the reference sine wave is provided by open loop amplifier 12 and is compared with the 50—50 duty cycle signal $E_3$ from amplifier 10 by OR circuit 14. If there is no difference in duty cycle of the signals being compared then, regardless of amplitudes, the result of the comparison is zero output (signal $E_3$ from OR circuit 14). The output when the duty cycles of the two signals ($E_3$, $E_4$) being compared are unequal is again a rectangular wave with a duty cycle proportional to shaft angle as was the duty cycle of signal $E_3$. However, now the waveform does not start with a 50—50 square wave at zero shaft angle as was the case with signal $E_3$, but starts as a set of two pulses of very narrow width due to slight circuit offsets and with an amplitude between either (+) or (−) supply and ground levels. The average value of this wave still depends on amplitude, but this amplitude is the supply voltage level which may be regulated to be within, for example, ± 1%. Also the d.c. component now does not depend on the difference of two large quantities as was the case with signal $E_3$, but depends only on the value of a single quantity whose duration and duty cycle is proportional to resolver shaft angle.

Thus, when signal $E_3$ from amplifier 10 is positive with respect to signal $E_4$ from amplifier 12, an NPN transistor 15 in OR circuit 14 (FIG. 1) conducts since its base is positive with respect to its emitter. However, a PNP transistor 17 is cutoff for the same reason. Since transistor 15 conducts it, in turn, draws current from the base of a PNP transistor 19 which causes the latter to be also conductive. This causes signal $E_5$ to be pulled up to approximately +15 volts, for example, as in FIG. 3. Since transistor 17 is non-conductive, an NPN transistor 21 is also non-conductive so that signal $E_5$ is unaffected by the transistors at this time. With further reference to FIG. 3, whenever signals $E_3$ and $E_4$ are equal there can not be any base current flowing in either transistors 15 or 17 so that all four transistors are cutoff. Signal $E_5$ simply stays at ground level since it is not pulled to either (+) or (−) 15 volts by the action of transistors 19 and 21.

It can be seen from FIG. 3, therefore, that as the duty cycle and hence the pulse width ($t$) of signal $E_3$ changes, then the pulse width ($t_1$) of signal $E_5$ likewise will change, with the latter being the difference between ($t$) and the constant duration (T) of reference square wave $E_4$. Thus, it has been demonstrated how the duty cycle of signal $E_5$ changes with shaft angle as does the duty cycle of signal $E_3$.

Finally when, as shown in FIG. 2, the signal from the nnon-inverting input terminal of amplifier 10 goes below zero corresponding to negative shaft angles, analysis will disclose that signal $E_3$ will have more time at negative saturation than at positive saturation. This will appear as a positive going narrow pulse designated as $E_3$ in FIG. 4. Referring to exclusive OR circuit 14 in FIG. 1, reference square wave $E_4$ is applied at one input as before and signal $E_3$ is applied at the other input. The wave relationships of these signals are shown in FIG. 4. Thus, new signal $E_3$ and the same signal $E_4$ from which the resulting output waveform $E_5$ is determined using the same reasoning as for FIG. 3.

This time signal $E_3$ is always either negative with respect to signal $E_4$ or equal to signal $E_4$ at the various instants of time in FIG. 4. Therefore, when signal $E_3$ is negative with respect to signal $E_4$ transistor 17 in OR circuit 14 conducts and transistor 15 is cutoff. Hence transistor 21 conducts and pulls signal $E_5$ down to approximately the −15 volt supply level. Also, since transistor 15 is cutoff, transistor 19 is also cutoff and has no effect on signal $E_5$. At other times, when signal $E_3$ equals signal $E_4$, neither transistor 15 or 17 can have any base current and so all four transistors are nonconducting. Signal $E_5$ then remains at ground level as before. It is thus shown (FIG. 3) that the duty cycle of signal $E_3$ is varied with resolver shaft angle causing the duty cycle of signal $E_5$ to vary for providing a varying positive d.c. component of signal $E_5$ and (FIG. 4) that signal $E_3$ varies with shaft angle causing the duty cycle of signal $E_5$ to vary for providing a varying negative d.c. output component of signal $E_5$.

It now is seen how positive and negative resolver shaft angles provide corresponding proportional positive and negative d.c. components of the rectangular waveform of signal $E_5$ in the output of exclusive OR circuit 14 shown in FIG. 1. Filter 16 removes ripple components from signal $E_5$ leaving the d.c. component as the required bipolar d.c. output of the resolver d.c. converter of the invention and which output is proportional to the inpout resolver shaft angle.

It will be seen from the aforenoted description of the invention that novel circuitry has been provided for converting resolver sine and cosine function outputs of shaft angle into a linear bipolar d.c. output function. The circuit is particularly adaptable to microelectronics techniques and thus has the advantages of accuracy and simplicity over the prior art.

Although but a single embodiment of the invention has been illustrated in detail, it is to be expressly understood that the invention is not limited thereto. Various changes may also be made in the design and arrangement of the parts without departing from the spirit and scope of the invention as the same will now be understood by those skilled in the art.

What is claimed is:

1. For use with a signal device of the type including an angularly displaceable element and providing two alternating signals varying as the sine and cosine of the angular displacement, a converter for converting said signals to a signal at a level corresponding linearly to the angular displacement, comprising:

means connected to the signal device and responsive to the sine and cosine signals therefrom for providing a first reference signal including a first phase shifting circuit connected to the signal device for shifting the phase of the sine signal therefrom, a second phase shifting circuit connected to the signal device for shifting the phase of the cosine signal therefrom, and means for combining the phase shifted signals for providing the first reference signal;

means connected to the signal device and to the first reference signal means and responsive to one of the signals from the signal device and to the first reference signal for providing a signal having a predetermined waveform;

means connected to the first reference signal means and responsive to the signal therefrom for providing a second reference signal; and means connected to the predetermined waveform signal means and to the second reference signal means and responsive to the signals therefrom for providing the signal at a level corresponding linearly to the angular displacement.

2. A converter as described by claim 1 wherein:

the first phase shifting circuit connected to the signal device for shifting the phase of the sine signal therefrom is arranged to provide a first predetermined phase lag to said sine signal; and the second phase shifting circuit connected to the signal device for shifting the phase of the cosine signal therefrom is arranged to provide a second predetermined phase lag to the cosine signal greater than the first predetermined lag.

3. A converter as described by claim 1, wherein the means connected to the signal device and to the first reference signal means and responsive to one of the signals from the signal device and to the first reference signal means for providing a signal having a predetermined waveform includes;

a demodulator connected to the signal source for demodulating the sine signal therefrom; and means connected to the demodulator and to the means for combining the phase shifted signals for providing the first reference signal and responsive to the signals therefrom for providing the signal having a predetermined waveform.

4. A converter comprising:

a signal device including an angularly displaceable element and providing two alternating signals varying as the sine and cosine of the angular displacement;

means connected to the signal device and responsive to the sine and cosine signals therefrom for providing a first reference signal;

means connected to the signal device and to the first reference signal means and responsive to the sine signal from the signal device and to the first reference signal for providing a signal as a pulse width modulated square wave signal;

means connected to the first reference signal means and responsive to the signal therefrom for providing a second reference signal as an unmodulated square wave signal; and means connected to the square wave signal means and the second reference signal means and responsive to the signals therefrom for providing a signal at a level corresponding linearly to the angular displacement.

5. For use with a signal device of the type including an angularly displaceable element and providing two alternating signals at a predetermined frequency and varying in amplitude as the sine and cosine of the angular displacement, a converter for converting said signals to a signal at a level corresponding linearly to the angular displacement, comprising:

means connected to the signal device and responsive to the sine and cosine signals therefrom for providing a first reference signal as a sinusoidal signal independent of the signal device element displacement and at the frequency of the signals from the signal device;

means connected to the first reference signal means and responsive to the signal therefrom for providing a second reference signal as an unmodulated square wave signal at the frequency of the signal from the signal device; and means connected to the first and second reference signal means and responsive to the signals therefrom for providing the signal at a level corresponding linearly to the angular displacement.

6. A converter comprising:

a signal device including an angularly displaceable element and providing two sinusoidal signals varying as the sine and cosine of the angular displacement;

means connected to the signal device and responsive to the sine and cosine signals therefrom for providing a sinusoidal first reference signal independent of the signal device element displacement;

means connected to the first reference signal means and responsive to the signal therefrom for providing a second reference signal as an unmodulated square wave signal; and means connected to the first and second reference signal means and responsive to the signals therefrom for providing a signal at a level corresponding linearly to the angular displacement including means for comparing the first and second reference signals and for providing a signal proportional to the angular displacement of the signal device element over a predetermined angular range and filter means connected to the comparing means for filtering the signal therefrom and for providing the linear signal.

7. For use with a signal device of the type including an angularly displaceable element and providing two alternating signals varying as the sine and cosine of the angular displacement, a converter for converting said signals to a signal at a level corresponding linearly to the angular displacement, comprising:

means connected to the signal device and responsive to the sine and cosine signals therefrom for providing a first reference signal;

means connected to the signal device and to the first reference signal means and responsive to one of the signals from the signal device and to the first reference signal for providing a signal having a predetermined waveform, including a demodulator connected to the signal source for demodulating the one signal therefrom and means connected to the demodulated signal and the first reference signal for providing the predetermined waveform signal as a pulse width modulated square wave signal;

means connected to the first reference signal means and responsive to the signal therefrom for providing a second reference signal; and means connected to the predetermined waveform signal means and to the second reference signal means and responsive to the signals therefrom for providing the signal at a level corresponding linearly to the angular displacement.

* * * * *